United States Patent [19]

Onozaki et al.

[11] 3,984,585
[45] Oct. 5, 1976

[54] VACUUM EVAPORATION PLATING METHOD

[75] Inventors: Jun Onozaki; Fukumatsu Sakaue, both of Minami-ashigara, Japan

[73] Assignee: Fuji Xerox Co., Ltd., Tokyo, Japan

[22] Filed: Jan. 16, 1975

[21] Appl. No.: 541,378

Related U.S. Application Data

[62] Division of Ser. No. 474,308, May 30, 1974.

[52] U.S. Cl. .................................. 427/55; 427/76; 427/248
[51] Int. Cl.² ......................................... B05D 3/06
[58] Field of Search .................. 427/50, 55, 59, 70, 427/76, 91, 99, 53, 124, 166, 248

[56] References Cited
UNITED STATES PATENTS

| | | | |
|---|---|---|---|
| 2,435,997 | 2/1948 | Bennett | 427/248 |
| 2,440,135 | 4/1948 | Alexander | 427/248 |
| 2,762,722 | 9/1956 | Truby | 427/55 |
| 3,849,129 | 11/1974 | Kinoshita et al. | 427/248 |

FOREIGN PATENTS OR APPLICATIONS

| | | | |
|---|---|---|---|
| 918,382 | 2/1963 | United Kingdom | 427/69 |

*Primary Examiner*—John H. Newsome
*Attorney, Agent, or Firm*—Gerald J. Ferguson, Jr.; Joseph J. Baker

[57] ABSTRACT

A method for vacuum-evaporating photosensitive material and the like including an infrared-radiating heater made of tungsten for example and covered with a protective covering made of quartz for example disposed adjacent a photosensitive material subject to fractional evaporation or distillation to inhibit or control the tendency thereof to fractionally evaporate.

4 Claims, 6 Drawing Figures

VACUUM EVAPORATION PLATING METHOD

This is a division of application Ser. No. 474,308, filed May 30, 1974.

BACKGROUND OF THE INVENTION

1. Field of the Invention

This invention relates to a method and apparatus for vacuum-evaporating a photosensitive material and the like and, in particular, to a method for evaporating a multi-element photosensitive material subject to fractional evaporation.

2. Discussion of the Prior Art

In a known vacuum evaporation method for forming a film of a substance on a substrate, the substance is heated in vacuum to evaporate and then deposit on the substrate to form a thin film of the substance. As well known, this method is in practical use in various fields as a film-forming technique. Particularly in xerograhy and its related fields, where selenium is a representative photosensitive material, vacuum evaporation is an essential technique for forming a photosensitive film. The known method has therefore been reviewed with a view to adapting it to the various characteristics required of photosensitive materials.

For forming a photosensitive film of a single element type, use has been made of an apparatus as shown in FIG. 1, in which the inside of a hermetic shell 1 is brought to a vacuum state by a vacuum pump where a quantity of evaporant or material 4 is disposed in a crucible 3. The crucible 3 is made of a known resistant material and heated to evaporate the material 4 by electric power supplied from a power supply 7 including a transformer 5 and a controller 6. A substrate 9 is mounted on a substrate holder 8 to permit deposition of the evaporated material. Although vacuum evaporation by this apparatus has been in use because it is satisfactory for the formation of films of the single element type, recent developments in research and development of multi-element photosensitive materials have rendered this apparatus inadequate.

Multi-element photosensitive materials comprises two or more elements. When these elements are in the form of an alloy, the conventional apparatus of FIG. 1 causes frictional evaporation for each of the elements. Assuming that the photosensitive material has two metallic elements A and B with A being more difficult to evaporate, the distribution of the elements with respect to the thickness of the substrate 9 will be such that B is relatively richer at the deeper portion of the film compared with the original composition of the source material, while A becomes relatively richer toward the surface, thus creating a non-uniform distribution of the elements. In some cases, the composition at the surface of the deposit film may be 40%A – 60%B for an original composition of 10%A – 90%B. The change in composition of the film tends to adversely affect the quality of an electrostatic photocopying process utilizing the film, particularly when the film is subject to abrasion. This is due to the fact that the film comes to have varied compositions depending on the degree of abrasion. Particularly when a photosensitive material, for use in electrostatic photocopying is used, the composition of the film directly affects the quality of the photocopying to such an extent that the quality depends directly on the distribution of the composition. For these reasons, the evaporation apparatus of FIG. 1 has proven to be inadequate. Attention has thus been given to evaporation methods capable of controlling the distribution of the composition while suppressing the temperature-dependent fractional evaporation of different elements.

Conventional fractional-evaporation-suppressed evaporation methods adapted to alloys and the like may be exemplified by flash heating and electron beam heating techniques. However, they are suited only for substrates of relatively small area. Even though applicable in principle to the mass production of substrates of large area, they are difficult to put into practical use because the uniformity of film quality cannot be ensured. Another disadvantage is that these techniques result in apparatus which is complicated, difficult to operate and relatively costly to manufacture.

SUMMARY OF THE INVENTION

With the foregoing points in mind, the present invention is intended to provide an improved evaporation method and apparatus for forming a deposit film of an arbitrary composition over a relatively large area of substrate with the influence of temperature-dependent fractional evaporation of elements suppressed, resulting in a simple apparatus easy to operate.

Other objects and advantages of the invention will become apparent from a reading of the specification and claims taken with the drawing.

DETAILED DESCRIPTION OF A PREFERRED EMBODIMENT OF THE INVENTION

In the method and apparatus of the invention, an infrared-radiating heater covered with a protective material is disposed adjacent a photo-sensitive source material subject to temperature-dependent fractional evaporation, so that the evaporation of the source material may be caused by radiation from the heater. The use of an exposed heater or of a heater disposed inside the photosensitive material may therefore not be within the scope of the invention. However, it should be noted that the use of the above-mentioned heater powerful enough to evaporate by itself the whole of the photosensitive source material comes under the scope of the invention, even when another heating method is concurrently used.

If the heater is exposed, the material constituting the heater is evaporated in the heated state to adversely affect the photosensitive material. It is for this reason that the heater is covered with protective material. For this purpose, a heater made of tungsten, for example, is covered with a quartz tube, for example. Since the temperature of tungsten may be raised to 3500°C, quartz tube covering is particularly suitable. The material for the heater protective covering member must have a high melting point and no mutual adverse effect on and from the photosensitive material. For the efficient radiation of heat from the heater to the photosensitive material, the heater covering member should preferably be a material transparent to infrared rays. When the radiation is once reflected for achieving uniform irradiation of the evaporant, the material may be opaque to infrared rays. Since the infrared-radiating heater is maintained in some cases at a considerably high temperature for a long period of time, a heat shield may be needed for avoiding the possible application of undesired heat to areas other than the photosensitive source material.

A description will now be given of several experiments which have been conducted to ascertain the technical merits of this invention.

Figure 2:
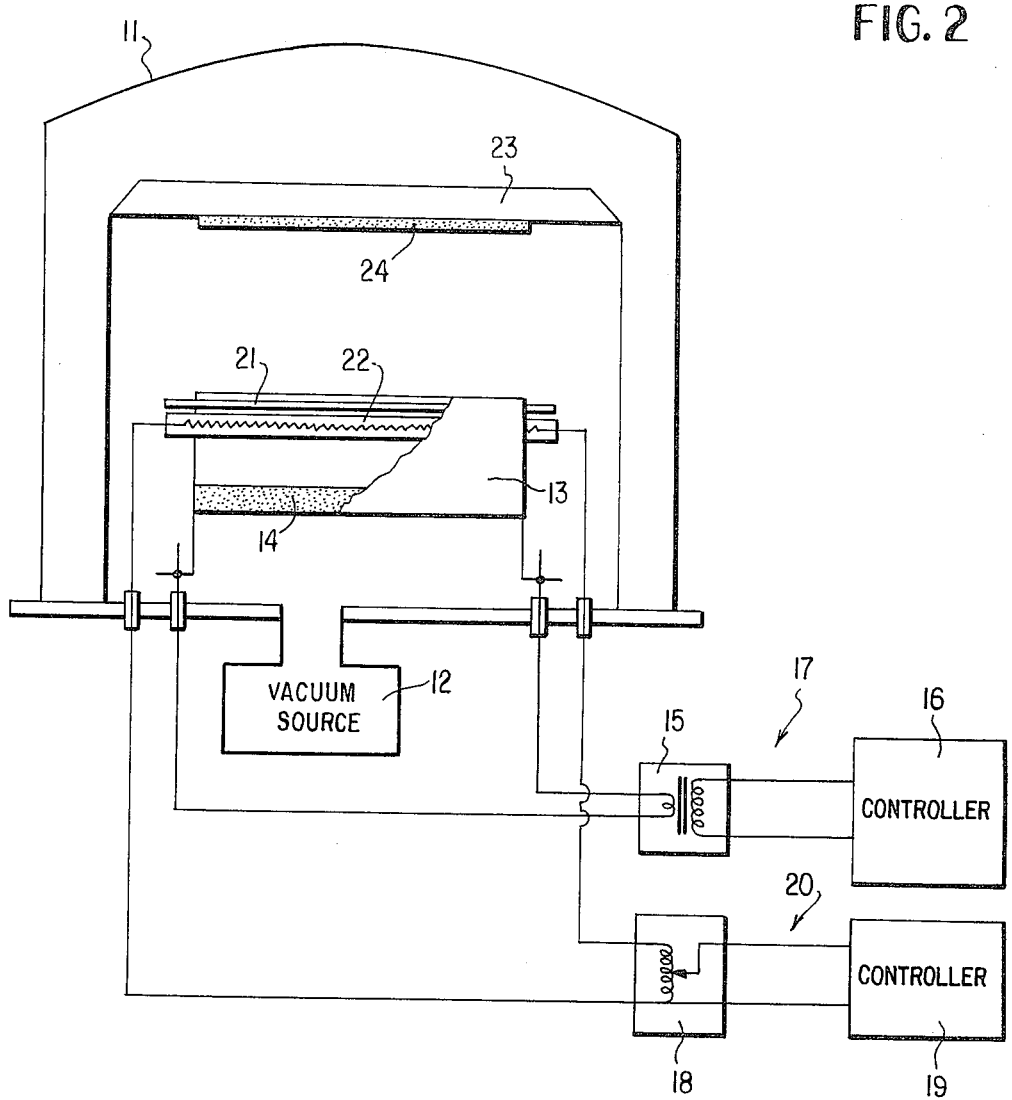
FIG. 2 is a schematic view of an illustrative evaporation apparatus of the present invention.
Figure 3:
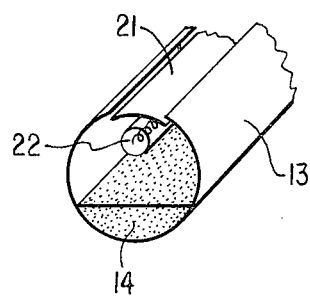
FIG. 3 is a perspective view of a portion of the apparatus of FIG. 2.

The apparatus used in Examples 1 to 3 hereinafter is as shown in FIGS. 2 and 3 where the inside of a hermetic shell 11 is brought to a vacuum state by a vacuum pump system 12, a quantity of photosensitive material 14 being disposed in a crucible 13. The crucible 13 is made of known resistant material and heated by electric power supplied from a power supply unit 17 including a transformer 15 and a controller 16. At the same time, an infrared-radiating heater 22 coupled to another power supply unit 20 including a transformer 18 and a controller 19 and covered at its upper portion with a shield plate 21 heats the source material 14 to evaporate it. A substrate 24 mounted on a substrate holder 23 receives the deposit of evaporated material. The shield 21, whose perspective view is shown in FIG. 3, prevents the spattering of material 14 on substrate 24 and, concurrently, prevents leakage of radiation from heater 22 outside of crucible 13. Throughout the following Examples, the photosensitive source material subject to fractional evaporation is 8% Te – 92% Se (where Te is tellurium and Se is selenium, % being by weight), 30 g of which is contained inside shell 11, which is maintained at $10^{-4}$ Torr.

EXAMPLE 1

Two different methods were used to ascertain technical merits of the present invention together with the fractional-evaporation-suppression effect. In the first and conventional method, use was made, in the apparatus of FIGS. 2 and 3, only of power supply 17. More specifically, source material 14 was heated by supplying electric power to crucible 13 so that heat was applied through that portion of material 14 in contact with crucible 13, transformer 15 supplying 5V, 1 KW power to crucible 13 at its full capacity. A current of 200A thus flowed through crucible 13 to heat the latter to a stable temperature of 600°C, where source material 14 was quickly evaporated. The temperature was measured by a C-A thermocouple brazed by silver to the outer bottom of crucible 13. Shell 11 was made of a transparent material and the decrease of source material 14 was observed as the evaporation proceeded, although the vapor itself was invisible. Within a period of five minutes after application of electric power, almost all 30g of the source material was evaporated, leaving a photosensitive film about 110 microns thick deposited on substrate 24.

In the second method according to this invention, electric power was not applied to crucible 13 and only power supply 20 was used to heat source material 14 by radiation from infrared-radiating heater 22. A 210V – 1 KW iodine lamp of the tungsten filament type was used as heater 22. Two minutes after power was applied, 30g of source material was almost totally evaporated, thus forming a deposit film 110 microns thick.

These data show that the second method, which is based on this invention, has a greater yield per a unit period of time for an equal amount of power consumption, and is therefore contributive to a reduction in manufacturing cost.

In both cases, the deposited film was 110 microns thick and smooth at its surface as described above. Quantitative analysis by an X-ray microanalyser on tellurium Te at five different points on each of the innermost portion (kept in contact with substrate 24) and the outermost portion (the surface) of the film showed that in the first method the concentration was 4 – 5% at the former portion and 10 – 40% at the latter while the coresponding figures in the second method were 7 –8% and 9 – 10% respectively. It follows therefore that fractional evaporation of the two elements of the source material is apparently suppressed in the second method, i.e., the method of this invention.

Since the quality of electrostatic photocopy depends greatly on the composition distribution at or near the surface of the photosensitive plate, with the concentration of tellurium being preferably less than 25% for practical purposes, the foregoing experimental results show that the present invention has achieved its objective.

EXAMPLE 2

This example was aimed at ascertaining the capability of the present method of controlling concentration distribution within the deposit film. The crucible 13 was initially supplied with power from power supply 17 for 5 minutes to maintain the temperature at 300°C, and then heater 22 was supplied with 210 Volt power by power source 20 for one minute, within which the 30g of source material was almost totally evaporated. Quantitative analysis by an X-ray microanalyser on tellurium at different points taken in the depth direction showed that the concentration ranged from 5 to 9% for the region of 0 – 90 microns from the substrate 24, while it ranged from 15 to 16% for the region of 90 – 110 microns.

When initial heating of crucible 13 was applied for 3 minutes maintaining it at 300°C, followed by the application of 210V to heater 22 for 2 minutes, the deposit film of tellurium ranged from 5 to 8% for the region of 0 – 70 microns from the substrate 24, while it range from 10 to 12% for the region of 70 – 110 microns.

The foregoing measurement, which was performed five times, proved that the present method has an excellent reproducibility, i.e., an excellent capability of achieving the same results repeatedly. It has been ascertained from these results that (1) when the present invention is combined with the conventional method, the concentration of tellurium can be arbitrarily controlled with respect to the depth of the film by changing the heating period and (2) the present invention ensures the excellent reproducibility.

EXAMPLE 3

This example was aimed at ascertaining the durability of a photosensitive deposit film formed according to the present invention.

Figure 1:
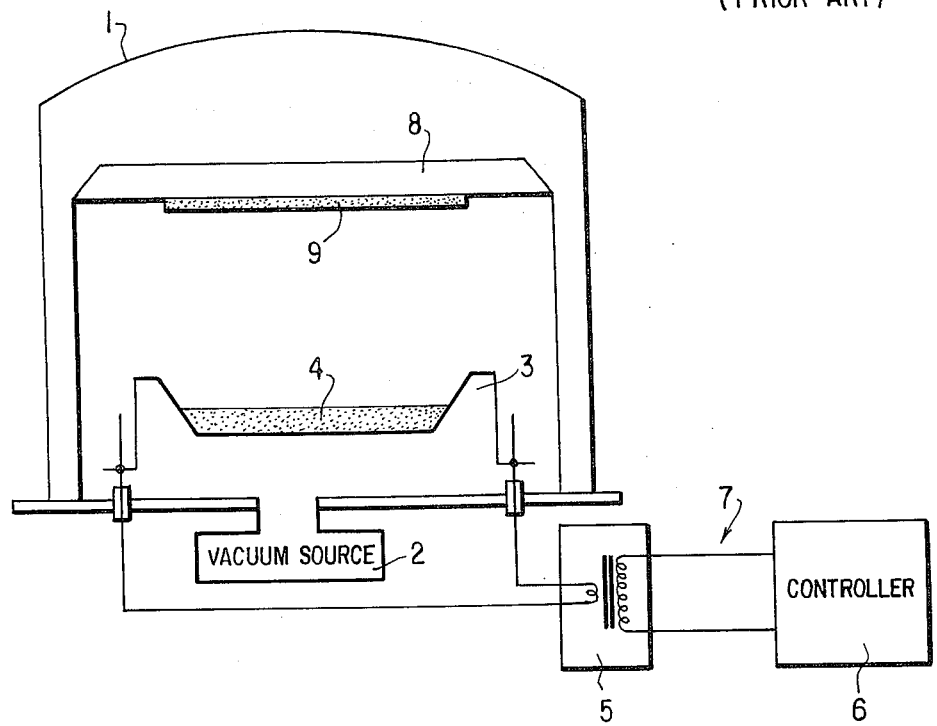
FIG. 1 is a schematic view of a known vacuum evaporation apparatus which has been in broad and general use.

Since Example 2 showed that a photosensitive material plate of an arbitrary composition distribution can be obtained with a small-scale vacuum evaporation apparatus, a similar film deposit of larger scale was formed, using a 2-meter long crucible and a cylindrical aluminum plate for use in a copying machine. The crucible 13 was first maintained at 300°C for 3 minutes and then heater 22 was heated to 2500°K and maintained thereat for 2 minutes. This resulted in a film deposit 110 microns thick, which was an average for five different samples. The film-coated aluminum plate was then used in a xerographic copying machine for test purpose. Five different samples of the aluminum plate proved to be free from any deterioration of copy quality up until the 100,000th copy on the average. Compared with a conventional photosensitive film formed with the apparatus of FIG. 1, which is capable of producing only 20,000 undeteriorated copies, the film of the present method has a markedly lengthened life.

EXAMPLE 4

This example was aimed at confirming that the technical merits of the present invention can be achieved even when use is made of evaporation apparatus, i.e., the crucible and the infrared-radiating heater, different from that shown in FIGS. 2 and 3.

Figures 4, 5, 6:
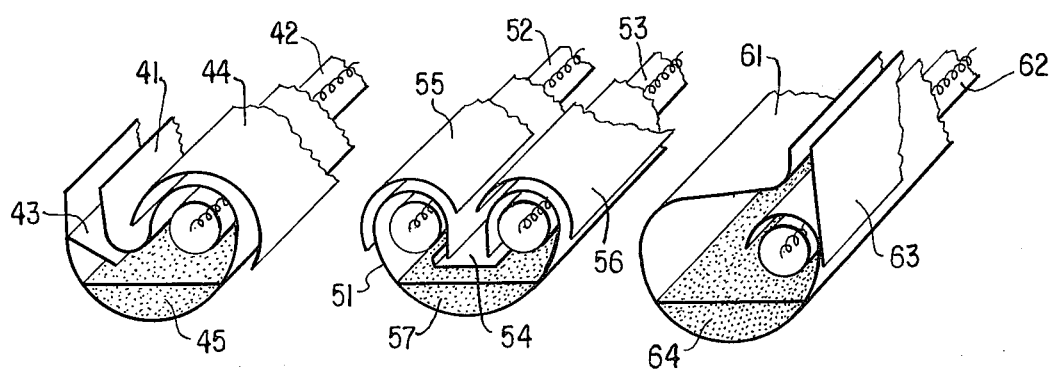
FIGS. 4, 5 and 6 are perspective views of other illustrative embodiments of the evaporation apparatus of the present invention.

In this example, the evaporation apparatuses shown in FIGS. 4, 5 and 6 were used, the remainder of the apparatus being as shown in FIG. 2. Referring to FIG. 4, there is shown a crucible 41, an infrared-radiating heater 42, a sputtering prevention shield 43, a radiation shield 44, and a photosensitive material 45. In FIG. 5, there is shown a crucible 51, two separate infrared-radiating heaters 52 and 53, spattering shield 54, heat shields 55 and 56, and a photosensitive material 57. Likewise, in FIG. 6, there is shown a crucible 61, an infrared-radiating heater 62, a guide means 63 and a photosensitive material 64.

The data obtained from the films formed by the use of these evaporation apparatuses was comparable to those obtained from the films in the apparatus shown in FIGS. 2 and 3. This shows that the evaporation method need not be of a predetermined shape.

As has been described, the present invention includes an infrared-radiating heater made of tungsten, for example, covered with a suitable protective material made of quartz for example, the heater being disposed adjacent a photosensitive material subject to fractional evaporation so that the photosensitive material may be evaporated by radiation from the heater. Various technical advantages result as follows:

1. Fractional evaporation can be reduced even when a photosensitive material subject to such evaporation is used. This makes it possible to provide photosensitive-film-coated plates having uniform characteristics, thus improving the yield. Also, the uniform distribution of the compositions is ensured with respect to film depth. No change in characteristics is seen even after the film has been abraded. This thus lengthens the life of the photosensitive-film-coated plate.

2. Compared with conventional flash heating or electron beam heating, the present invention involves a simpler apparatus, which requires a smaller investment for production work and which is easier to operate and maintain. Besides these advantages, the thermal capacity of the apparatus of the present method can be made so small that the apparatus may be operated after a relatively abrupt temperature change without delay. Furthermore, the manufacture of a large photosensitive-film-coated plate is easily achieved either by arranging crucibles side by side or by using one long crucible.

3. Faster evaporation is achieved compared with the conventional method, improving the productivity and reducing the cost of manufacture of photosensitive material.

4. When combined with the conventional method, as described with respect to FIG. 1, the present invention makes it possible to arbitrarily control the composition of the film with respect to its depth, and thereby to permit exploration of better film characteristics.

What is claimed is:
1. A method for vacuum-evaporating a photosensitive multi-element material having at least first and second elements where said first element evaporates less readily then said second element, said method comprising the steps of
  containing said photosensitive multi-element material;
  radiating infrared radiations from an infrared radiation source onto the upper surface of said material to evaporate the material;
  preventing evaporation of the material of the infrared radiation source into said multi-element material by interposing a protective cover between said infrared radiation source and said multi-element material so that said infrared radiation can reach said multi-element material but said material of the radiation source cannot reach the multi-element material nor can the multi-element material reach said infrared radiation source; and
  receiving the vapors of said multi-element material to form a photosensitive film deposit of said material on said receiving means.

2. A method as in claim 1 including additionally heating said multi-element material from beneath the upper surface thereof.

3. A method as in claim 1 where said multi-element material is a mixture of selenium and tellurium.

4. A method as in claim 3 where said mixture contains approximately 92% selenium by weight and 8% tellurium by weight, the percentage of tellurium near the surface of the deposited film being less than 25% by weight.

* * * * *